United States Patent
Vilas Boas et al.

(10) Patent No.: US 10,734,975 B1
(45) Date of Patent: Aug. 4, 2020

(54) CURRENT-CONTROLLED OSCILLATOR

(71) Applicant: NXP USA, Inc., Austin, TX (US)

(72) Inventors: Andre Luis Vilas Boas, Campinas (BR); Felipe Ricardo Clayton, Campinas (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/406,256

(22) Filed: May 8, 2019

(51) Int. Cl.
| | |
|---|---|
| *H03K 4/50* | (2006.01) |
| *H03K 3/012* | (2006.01) |
| *G06F 1/06* | (2006.01) |
| *H03K 3/037* | (2006.01) |

(52) U.S. Cl.
CPC ............. *H03K 3/012* (2013.01); *G06F 1/06* (2013.01); *H03K 3/037* (2013.01); *H03K 4/50* (2013.01)

(58) Field of Classification Search
CPC .......... H03K 4/501; H03K 4/502; H03K 4/06; H03K 4/08; H03K 4/48
See application file for complete search history.

(56) References Cited

U.S. PATENT DOCUMENTS

| | | | | |
|---|---|---|---|---|
| 5,426,384 A * | 6/1995 | May | ........................ | H03K 3/017 327/52 |
| 7,741,887 B2 * | 6/2010 | Kubo | ........................ | H03K 4/06 327/131 |
| 8,026,770 B2 | 9/2011 | Shahparnia | | |
| 8,085,102 B2 | 12/2011 | Muller | | |
| 8,115,523 B2 * | 2/2012 | Lynch | ..................... | H02J 7/345 327/131 |
| 8,350,631 B1 | 1/2013 | Wadhwa et al. | | |
| 8,643,443 B1 | 2/2014 | Wang | | |
| 8,692,625 B2 * | 4/2014 | Sinitsky | ................. | H03K 3/011 331/111 |
| 8,773,210 B2 | 7/2014 | Sinha et al. | | |
| 9,099,994 B2 | 8/2015 | Thomsen et al. | | |
| 9,214,927 B2 | 12/2015 | Wang | | |
| 9,306,492 B2 * | 4/2016 | Kim | .......................... | H03B 5/02 |
| 9,602,052 B2 * | 3/2017 | Satoh | ........................ | G06F 1/04 |
| 10,256,797 B2 * | 4/2019 | Lam | ........................ | H03L 7/107 |
| 10,312,887 B2 * | 6/2019 | Yang | ........................ | H03K 4/50 |

(Continued)

OTHER PUBLICATIONS

Michael P. Flynn et al., A 1.2-μm CMOS Current-Controlled Oscillator—IEEE Journal of Solid-State Circuits, vol. 27, No. 07, Jul. 1992, IEEE, US.

(Continued)

*Primary Examiner* — Thomas J. Hiltunen

(57) ABSTRACT

A current-controlled oscillator receives an input current. Ramp voltage generating circuitry generates first and second ramp voltages in response to the input current. Selecting circuitry selects one of the first and second ramp voltages depending on their relative values. Switching circuitry receives a selected ramp voltage, generates a signal based on the selected ramp voltage relative to a reference voltage, and outputs a clock signal. In one embodiment, a comparator receives the reference voltage, one of the first and second ramp voltages, and outputs a comparison signal. Logic circuitry controls the ramp voltage generating circuitry to output one of the ramp voltages during one half of a clock cycle and to output the other ramp voltage during another half cycle of the clock signal based on the comparison signal and logic states of the logic circuitry.

11 Claims, 7 Drawing Sheets

(56) References Cited

U.S. PATENT DOCUMENTS

| | | | | |
|---|---|---|---|---|
| 10,461,724 B2 * | 10/2019 | Hurwitz | ............... | H03L 7/0995 |
| 10,523,116 B2 * | 12/2019 | Dietrich | .................... | G06F 1/04 |
| 2019/0310141 A1 * | 10/2019 | Geetla | .................. | G01K 15/005 |

OTHER PUBLICATIONS

J. Day et al., A 65μA 8MHz On-Chip Oscillator with LDO Regulator for Low-Power Handheld SoC Applications—9th International Conference on Solid-state and Integrated-Circuit Technology, 2008, IEEE, US.

Jiacheng Wang et al., A 12.4-kHz On-chip RC Oscillator with Comparator Offset Cancellation for PVT Variation Tolerance, 2016, IEEE, US.

Jiacheng Wang et al., A 13.5-MHz Relaxation Oscillator with +/−0.5% Temperature Stability for RFID Application, 2016, IEEE, US.

Ningxi Liu et al., A 2.5 ppm/degree Celsius 1.05 MHz Relaxation Oscillator with Dynamic Frequency-Error Compensation and 8 μs Start-up Time, 2018, IEEE, US.

Lin Ma et al., A Merged Window Comparator Based Relaxation Oscillator with Low Temperature Coefficient, 2017, IEEE, US.

* cited by examiner

CURRENT-CONTROLLED OSCILLATOR

BACKGROUND

Field

This invention relates generally to electrical circuits, and more specifically to a current-controlled oscillator.

Related Art

A traditional architecture for a current-controlled oscillator, which uses two current sources, two comparators and a latch, is popular due to a trade-off between simplicity and performance. However, the traditional architecture requires two current sources or resistors. Furthermore, the two comparators of the traditional architecture occupy a large area for low cost designs or consume a considerable amount of current for low power applications.

FIG. 1 is a schematic of a known current-controlled oscillator 100 that uses the traditional architecture to output clock signals CLK1 and CLK2. The known current-controlled oscillator (hereinafter, "known oscillator") 100 comprises comparator 101, comparator 102, capacitor 111, capacitor 112 and a latch 130. The known oscillator 100 also comprises a switch 131 coupled between a ground terminal and a non-inverted input terminal of comparator 101, and a switch 132 coupled between the ground terminal and a non-inverted input terminal of comparator 102. Switch 131 and switch 132 are controlled by CKL1 and CKL2, respectively. The known oscillator 100 employs a first current source (or high value resistor) ICH1 141 coupled to the non-inverted input terminal of comparator 101, second current source (or high value resistor) ICH2 142 coupled to the non-inverted input terminal of comparator 102, and a voltage reference $V_{REF}$ coupled to an inverted input terminal of comparator 101 and comparator 102. Whenever a voltage at either of the non-inverted input terminal of comparator 101 and the non-inverted input terminal of comparator 102 reaches $V_{REF}$, the voltage toggles the latch 130. For example, comparator 101 resets the latch 130 and comparator 102 sets the latch. Each comparator 101 and 102 generates only short pulses to toggle the latch 130. Each comparator 101 and 102 toggles the latch 130 once every cycle. In a half cycle, capacitor 111 is charged and capacitor 112 is grounded. In a next half cycle, capacitor 112 is charged and capacitor 111 is grounded. Comparator 101 and 102 are both in a frequency-generation path of the known oscillator 100.

In the known oscillator 100 attainment of a 50% duty cycle relies on matching of the first and second current sources 141 and 142 and on matching of the comparators 101 and 102, a mismatch of either type could result in the duty cycle varying from ideal by as much as 5%.

Although the known oscillator 100 uses only one voltage reference $V_{REF}$, some other known current-controlled oscillators disadvantageously require more than one voltage reference.

BRIEF DESCRIPTION OF THE DRAWINGS

The present invention is illustrated by way of example and is not limited by the accompanying figures, in which like references indicate similar elements.

DETAILED DESCRIPTION

New integrated circuit designs require higher efficiency where lower current consumption and smaller area are as important as functionality and performance. The current-controlled oscillators in accordance with the invention address this requirement, by employing a single comparator in a frequency generation path. By employing a single comparator and a single current source (or high value resistor) in the frequency generation path, the power consumption of current-controlled oscillators in accordance with the invention can be a little as half of the power consumption of known current-controlled oscillators. The current-controlled oscillators in accordance with the invention reduce area, decrease power consumption and have performance advantages. The single comparator architecture in the frequency generation path contributes to make the 50% duty cycle of the current-controlled oscillators in accordance with the invention closer to ideal because a mismatch between two comparators is not possible and a mismatch between two current sources is not possible.

Figure 1:
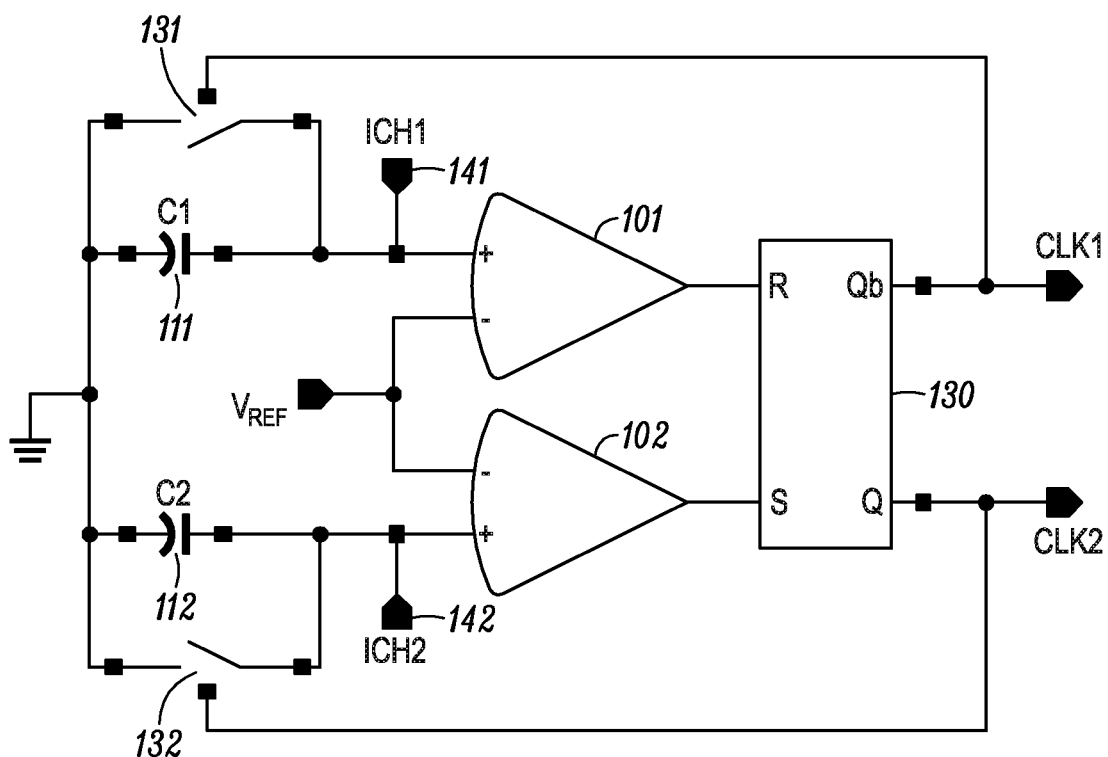
FIG. 1 is a schematic of a known current-controlled oscillator.
Figure 2:
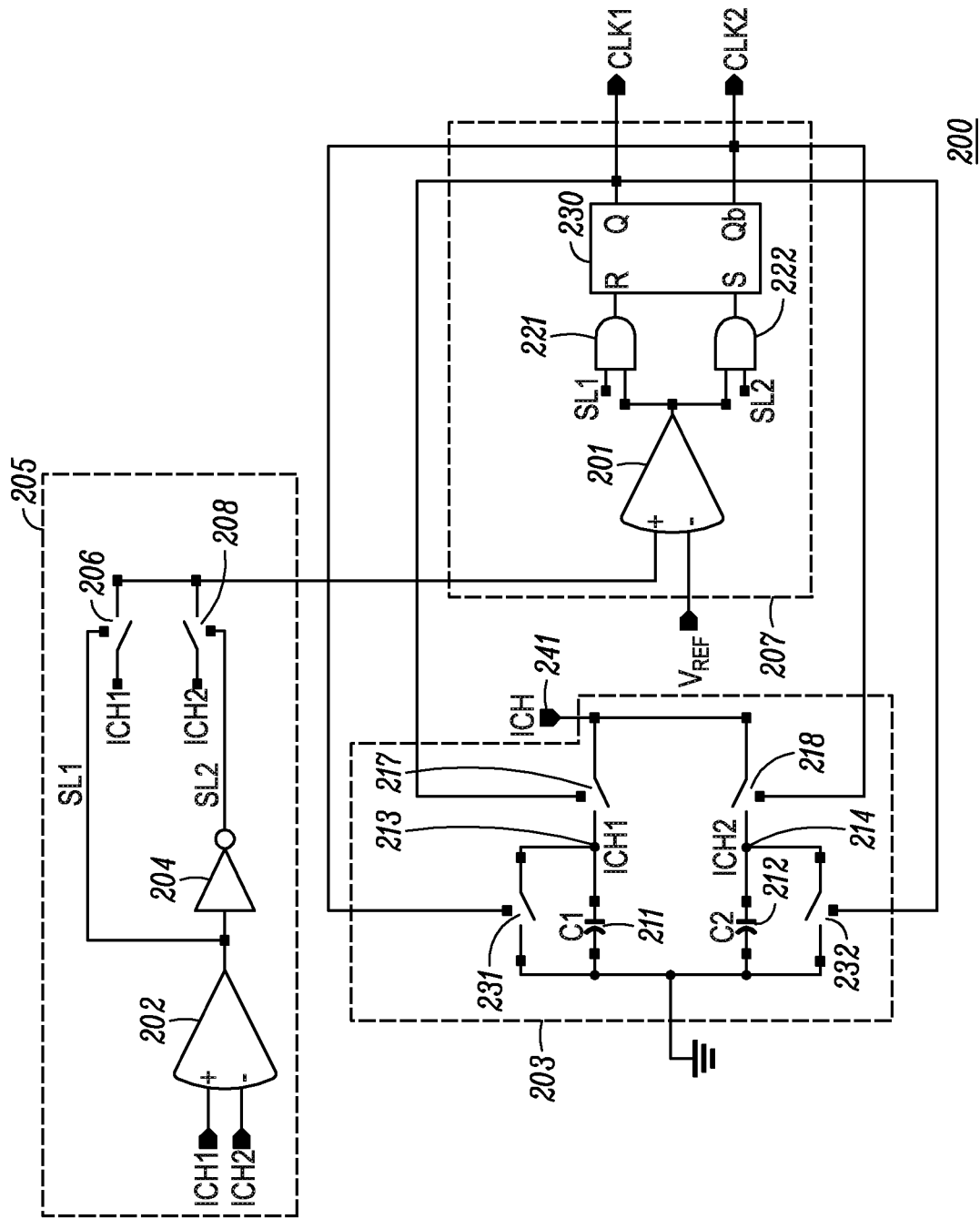
FIG. 2 is a schematic of a current-controlled oscillator in accordance with one embodiment of the invention.

FIG. 2 is a schematic of a current-controlled oscillator 200 in accordance with one embodiment of the invention. The current-controlled oscillator (hereinafter, "oscillator") 200 is a relaxation oscillator because its non-linear switched nature produces a non-sinusoidal repetitive output signal, such as a triangle wave or square wave. The oscillator 200 outputs clocks signals CLK1 and CKL2. In one embodiment, the oscillator 200 is disposed in a single die as an integrated circuit.

The oscillator 200 comprises a ramp voltage generating sub-circuit 203, a ramp voltage selecting sub-circuit 205 and a switching signal generating sub-circuit 207. The switching signal generating sub-circuit 207 comprises a comparator 201 that is in a frequency generation path of the oscillator 200. The ramp voltage selecting sub-circuit 205 comprises a comparator 202 that is not in the frequency generation path.

The ramp voltage generating sub-circuit 203 comprises capacitor 211 coupled between a ground terminal and an ICH1 node 213, and capacitor 212 coupled between the ground terminal and an ICH2 node 214. Capacitors 211 and 212 are identical in size and value. In one embodiment, capacitors 211 and 212 have a value of 1 pF. The capacitors 211 and 212 are disposed in the die of the integrated circuit of the oscillator 200. In the oscillator 200 attainment of a 50% duty cycle relies on matching of capacitors 211 and 212 (and not on matching of current sources or comparators as with the known oscillator 100), and, if there is a mismatch of the capacitors, the duty cycle typically varies from ideal by no more than 0.5%.

The ramp voltage generating sub-circuit 203 also comprises a switch 217 coupled between node ICH1 213 and an input terminal ICH 241, and a switch 218 coupled between node ICH2 214 and the input terminal ICH 241. Input terminal ICH 241 is coupled to a current source (not shown). Switch 217 and switch 218 are controlled by the clock signals CLK1 and CLK2, respectively. As a result, one of node ICH1 213 and node ICH2 214 is connected to the current source at any time. In one embodiment, a value of the current source ranges from approximately 10 μA to approximately 11 μA. The oscillator 200 advantageously requires only one current source.

The ramp voltage generating sub-circuit 203 further comprises switch 231 coupled between the ICH1 node 213 and the ground terminal, and a switch 232 coupled between the ICH2 node 214 the ground terminal. Switch 231 is controlled by CLK2, and switch 232 is controlled by CLK1. Based on the states of switches 217, 218, 231 and 232, the ramp voltage generating sub-circuit 203 generates, during alternate cycles, a first ramp voltage at node ICH1 213 based on a voltage across capacitor C1 211, and a second ramp voltage at node ICH2 214 based on a voltage across capacitor C2 212. The first and second ramp voltages are coupled to the ramp voltage selecting sub-circuit 205.

The value of the current source, the value of the capacitors C1 201 and C2 202, and the value of $V_{REF}$ control the frequency of oscillation of the oscillator 200, such that the higher is the value of the current source coupled to input terminal ICH 241, the higher is the frequency of oscillation. The higher is the value of capacitance or the value of $V_{REF}$, the lower is the frequency of oscillation. Neglecting switching delays, an ideal frequency of oscillation is related to the control current by the following equation:

$$f_{ideal} = \frac{I_C}{2CV_{ref}}.$$

In one embodiment, the oscillator 200 operates at 16 MHz. In another embodiment, the oscillator 200 operates at 64 MHz. Other frequencies of oscillation are foreseeable.

An inverted input terminal of the comparator 201 is coupled to a voltage reference $V_{REF}$. In one embodiment, $V_{REF}$ is approximately 0.3V and originates in a circuit that is not subject of this invention. Unlike some known current-controlled oscillators, the oscillator 200 advantageously requires only one voltage reference.

The ramp voltage selecting sub-circuit 205 comprises a comparator 202 having a non-inverted input terminal for receiving the first ramp voltage, an inverted input terminal for receiving the second ramp voltage and an output terminal for producing an SL1 signal. The ramp voltage selecting sub-circuit 205 comprises an analog switch 206 coupled between the ICH1 node 213 and a non-inverted input terminal of comparator 201 of the switching signal generating sub-circuit 207. The output terminal of comparator 202 is also coupled to an inverter 204 whose output is a SL2 signal. Comparator 202 evaluates the ramp voltages generated by the ramp voltage generating sub-circuit 203. The ramp voltage selecting sub-circuit 205 further comprises an analog switch 208 coupled between the ICH2 node 214 and the non-inverted input terminal of comparator 201 of the switching signal generating sub-circuit 207. Switch 206 is controlled by signal SL1 and switch 208 is controlled by signal SL2 such that, at any time, one of node ICH1 213 and node ICH2 214 is coupled to the switching signal generating sub-circuit 207. Switches 206 and 208 in conjunction with signals SL1 and SL2 form an analog multiplexer. Therefore, ramp voltage selecting sub-circuit 205 causes the switching signal generating sub-circuit 207 to receive one of the first ramp voltage and the second ramp voltage that is generated by the ramp voltage generating sub-circuit 203.

Because comparator 202 is not in the frequency generation path it advantageously does not need to be a fast as comparator 201. For example, after CLK1 rises to logic "1", SL1 can stay low (logic "0") as long as CLK1 remains high. In other words, $T_{DELAY}$ (see FIG. 3) can be as long as almost half a cycle. Therefore, comparator 202 can be much slower than comparator 201. Comparator 201 needs receive the voltage of one of capacitor C1 201 and capacitor C2 202 only at the moment that the voltage of each capacitor reaches $V_{REF}$. During $T_{DELAY}$, the comparator 201 is receiving the voltage of the capacitor that had been grounded in the previous half cycle. When the switches that are coupled to nodes ICH1 213 and ICH2 214 swap states, and comparator 202 toggles. Because comparator 202 consumes a small amount of current relative to the current consumed by comparator 201, the time it takes ($T_{DELAY}$) before comparator 202 toggles may be few nanoseconds to tens of nanoseconds. $T_{DELAY}$ can be any value provided that comparator 202 toggles prior to a next swap of the states of the switches that are coupled to nodes ICH1 213 and ICH2 214.

In another embodiment (not shown) of the ramp voltage selecting sub-circuit 205, the output of comparator 202 is connected to a non-overlapping clock circuit (not shown) to control switches 206 and 208 that send one of the voltage at node ICH1 213 and ICH2 214 to the non-inverted input of comparator 201. The non-overlapping clock circuit, if present, prevents both control switches 206 and 208 from being closed at a same time. In other words, the optional non-overlapping clock circuit assures that before control switch 208 is closed, control switch 206 is open.

The switching signal generating sub-circuit 207 comprises comparator 201 having a non-inverted input terminal coupled to the ramp voltage selecting sub-circuit 205 and an inverted input terminal coupled to a voltage reference $V_{REF}$. An output terminal of comparator 201 is coupled to an R (reset) input pin of a latch 230 through an analog switch and to an S (set) input pin of the latch through an analog switch 222. Switch 221 is controlled by the output signal SL1 of the comparator 202, and switch 222 is controlled by the output signal SL2 of the inverter 204 such that, at any time, the output terminal of comparator 201 is coupled to one of the R input pin of latch 230 and the S input pin of the latch. Consequently, comparator 202 causes an output of comparator 201 to be directed to one of the R input pin and the S input pin of the latch 230. A Qb output pin of the latch 230 provides the CLK1 signal, and a Q output pin of the latch provides the CLK2 signal. In the illustrated embodiment, each of switches 221 and 222 is implemented as an AND gate. Switches 221 and 222 in conjunction with signals SL1 and SL2 form an analog demultiplexer.

Comparator 201 toggles the latch 230 every half cycle. Comparator 202 merely selects which input (R or S) of the latch 230 the comparator 201 will drive, which allows comparator 202 to operate more slowly (and consume less current) than comparator 201 and more slowly (and consume less current) than comparators 101 and 102 of the known oscillator 100. Comparator 202 also selects which node (ICH1 213 or ICH2 214) comparator 201 compares against $V_{REF}$.

With known current-controlled oscillators, such as the known oscillator 100, a total current consumption of the comparators is approximately 40 μA. With the oscillator 200, the total current consumption of the comparators is 22 μA because comparator 202 does not need to be as fast or accurate as comparator 201 needs to be. In one embodiment, comparators 201 and 202 are exactly the same type, and comparator 202 is made to be slower by biasing it with lower currents. A bias input current to each comparator 201 and 202 is not shown in the drawings but is well known to persons skilled in the art.

Oscillators such as the oscillator 200 are often used as an internal RC oscillator within a power management system. An internal RC oscillator is regularly turned on whenever a power management controller (PMC) of an integrated circuit performs operations that involves a state machine. The internal RC oscillator provides a clock for the state machine of the PMC even when an analog portion of the PMC is in an ultra-low-power mode which is defined as $I_{DD}$ being less than 500 nA. In some applications, the internal RC oscillator is turned on even when the PMC is in the ultra-low-power mode. Therefore, saving a couple of µA is important to preserve low power characteristics of the PMC system. Therefore, saving several µA in an oscillator such as the oscillator 200 is important to maintain a low power profile of the PMC system.

The architecture of the oscillator 200 allows a size of comparator 202, as well as its power consumption, to be advantageously reduced relative to a size of comparator 201, in case area savings is important. However, the size of comparator 202 may be similar to the size of comparator 201, or even of exactly the same type, but biased with a lower current, in case area savings is not important.

Comparator 201 is a high-speed comparator; however, comparator 202 does not need to be a high speed comparator. By "speed" of a comparator, it is meant the propagation delay of the comparator. The propagation delay of a comparator is generally the same for a given bias current. As a rule of thumb, the propagation delay should be 1/10 of the clock period.

Figure 3:
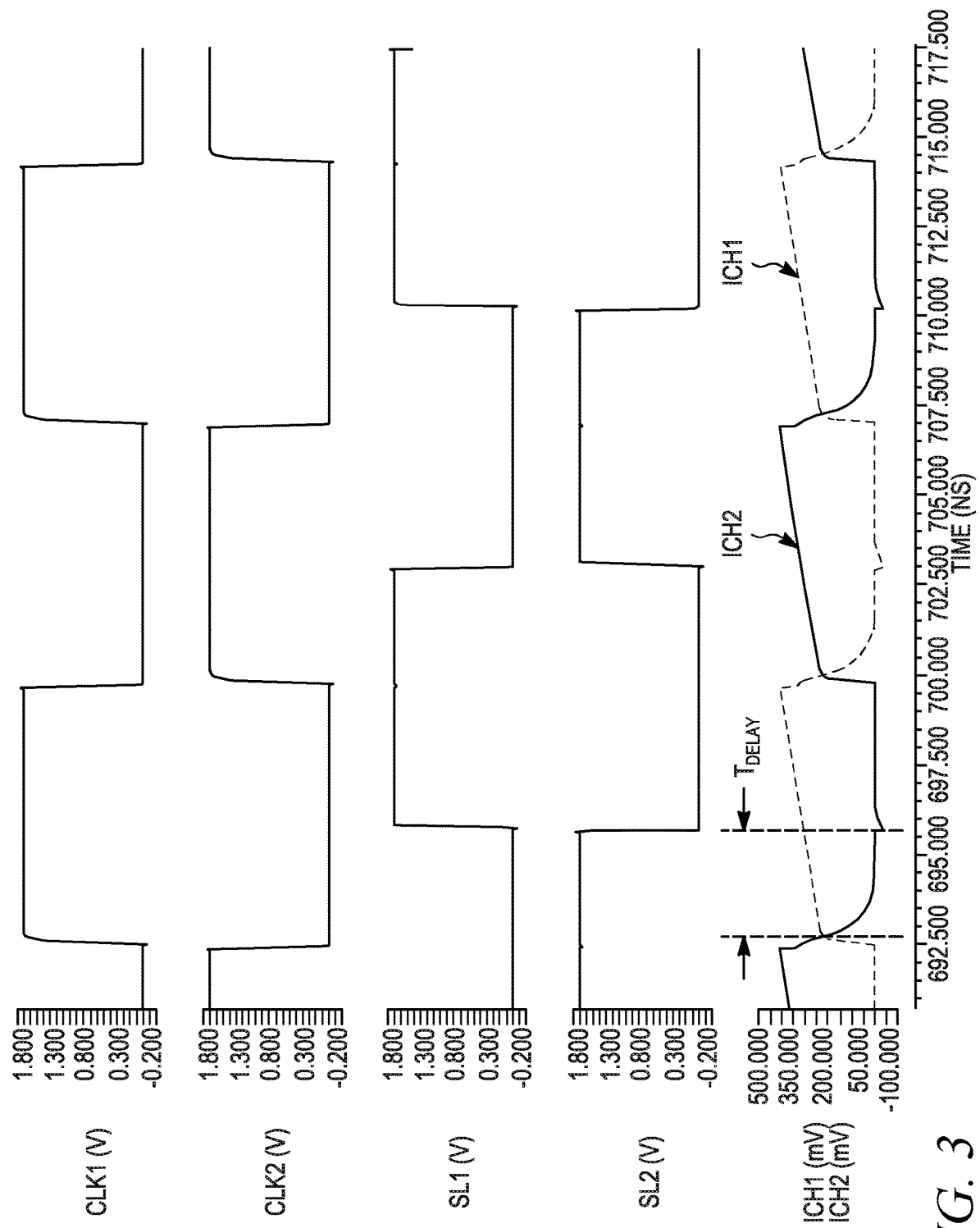
FIG. 3 is a graph of signals present in a simulation of the current-controlled oscillator shown in FIG. 2.

FIG. 3 is a graph of signals present in a simulation of the oscillator 200 operating at 64 MHz. The output signal SL1 from comparator 202 changes state when the voltage at node ICH1 213 and the voltage at node ICH2 214 crosses each other (the voltage at ICH1 213 rising and the voltage at ICH2 214 being reset to ground). Because comparator 202 is a low speed comparator, its switching delay $T_{DELAY}$ is naturally longer than the switching delay of a high speed comparator, such as comparator 201. As a result, comparator 201 senses the voltage at node ICH1 213 and ICH2 214 only after a switching delay of 3 ns to 5 ns, in other words $T_{DELAY}$=3-5 ns.

The bias current of the comparator 201 when the oscillator 200 is operating at 16 MHz is approximately 10 µA. However, the bias current of the comparator 202 when the oscillator 200 is operating at 16 MHz is advantageously only approximately 2 µA. Therefore, when the oscillator 200 is operating at 16 MHz, comparators 201 and 202 would consume a total of approximately 12 µA. In contrast, if the known oscillator 100 were to operate at 16 MHz, comparators 101 and 102 would consume approximately 10 µA each, for a total of approximately 20 µA. Consequently, at 16 MHz, the current saving of oscillator 200 versus known oscillator 100 is approximately 40% depending on the process corner. In a simulation of the oscillator 200, the total current consumption of the oscillator at 16 MHz approximately.

The bias current of the comparator 201 when the oscillator 200 is operating at 64 MHz is approximately 18 µA. However, the bias current of the comparator 202 when the oscillator 200 is operating at 64 MHz is advantageously only approximately 10 µA. Therefore, when the oscillator 200 is operating at 64 MHz, comparators 201 and 202 would consume a total of approximately 28 µA. In contrast, if the known oscillator 100 were to operate at 64 MHz, comparators 101 and 102 would consume approximately 18 µA each, for a total of approximately 36 µA. Consequently, at 64 MHz, the current saving of oscillator 200 versus known oscillator 100 is approximately 22% depending on the process corner.

Figure 4:
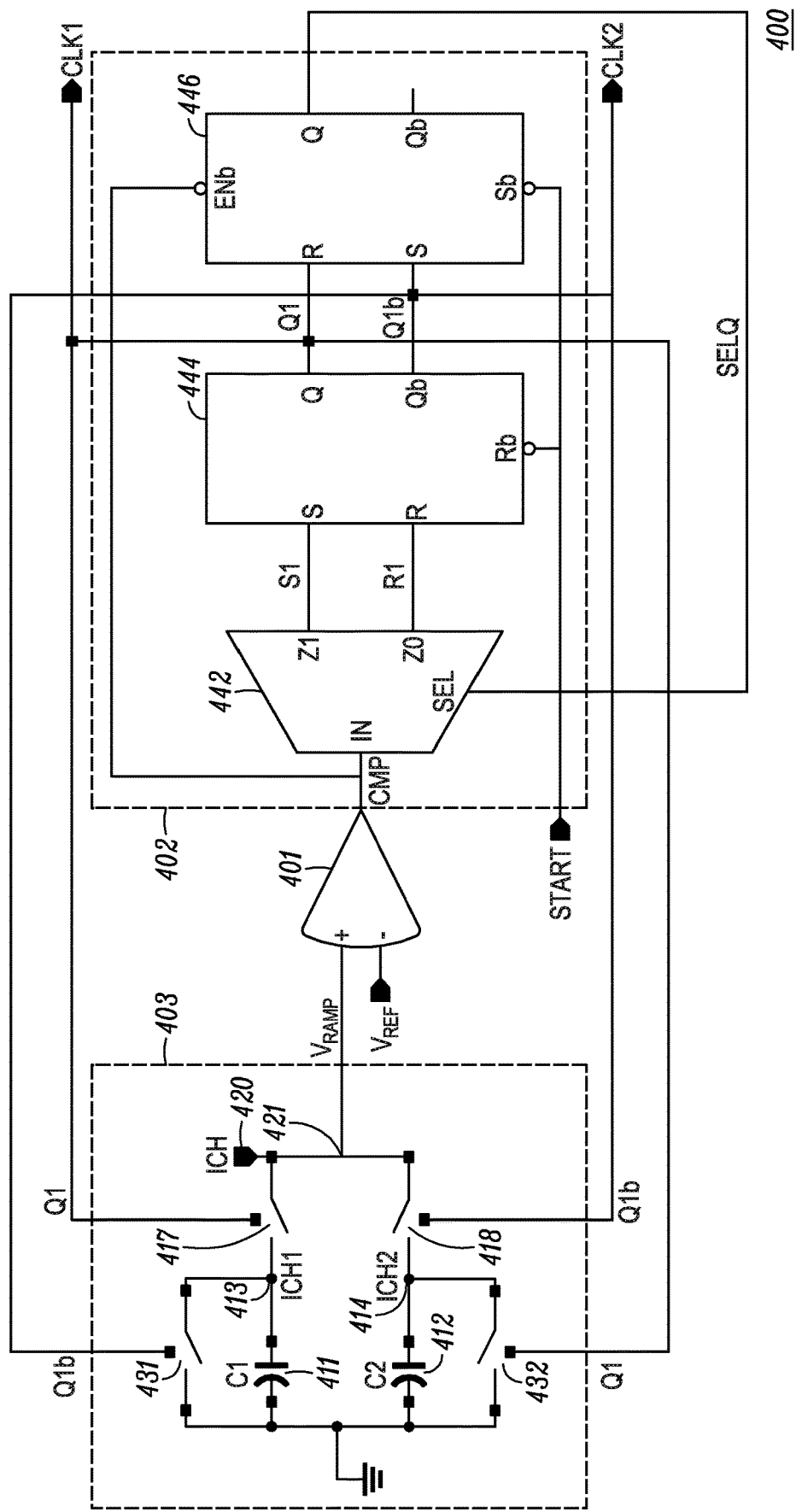
FIG. 4 is a schematic of a current-controlled oscillator in accordance with another embodiment of the invention.

FIG. 4 is a schematic of a current-controlled oscillator 400 in accordance with another embodiment of the invention. The current-controlled oscillator (hereinafter, "oscillator") 400 is a relaxation oscillator. The oscillator 400 outputs clocks signals CLK1 and CKL2. In one embodiment, the oscillator 400 is disposed in a single die as an integrated circuit. The oscillator 400 comprises a single comparator 401, logic control circuitry 402, and a ramp voltage generating sub-circuit 403. The ramp voltage generating sub-circuit 403 generates a ramp voltage $V_{RAMP}$. The single comparator 401, which is in a frequency generation path of the oscillator 400, performs threshold detection of $V_{RAMP}$ relative to a reference voltage $V_{REF}$. The logic control circuitry 402 performs selection of $V_{RAMP}$ emanating from one of capacitor C1 411 and capacitor C2 412.

The ramp voltage generating sub-circuit 403 includes analog switches 417, 418, 431 and 432. Capacitor C1 411, capacitor C2 412 and switches 417, 418, 431 and 432 are coupled in a manner analogous to how similarly-located components are coupled in FIG. 2. A current source (not shown) is coupled to an input terminal ICH 420 and supplies current to capacitor C1 411 and capacitor C2 412, but not at the same time. A value of the current source controls, in part, a frequency of oscillator of the oscillator 400.

Switches 417, 418, 431 and 432 may change accordingly to the embodiment (NMOS, PMOS or both) due to physical properties required to fulfill design conditions. To simplify the drawings without prejudice of generality, the following convention is adopted: switches 417 and 418 with capital letter H represent switches that are closed when a control signal for the switch is logic "0" and open when the control signal for the switch is logic "1"; switches 431 and 432 with capital letter L represent switches that are closed when a control signal for the switch is logic "1" and open when the control signal for the switch is logic "0". The switch 431 is used to connect node ICH1 413 to a ground terminal depending on a value of a Q1b signal. The switch 432 is used to connect node ICH2 414 to the ground terminal depending on a value of a Q1 signal. The switches 417 and 418 are used to connect one of node ICH1 413 and node ICH2 414 to the comparator 401, depending on values of the Q1 signal and the Q1b signal.

The comparator 401 includes a non-inverted input terminal for receiving the $V_{RAMP}$ signal from the ramp voltage generating sub-circuit 403, an inverted input terminal for receiving a reference voltage $V_{REF}$ and an output terminal for outputting a CMP signal.

The logic control circuitry 402 comprises a demultiplexer 442, latch 444 and latch 446. Unlike some known current-controlled oscillators that use one or more flip-flops which do not account for possible timing issues, the oscillator 400 advantageously uses latches 444 and 446 instead of flip-flops.

The demultiplexer 442 has an input data line for receiving the CMP signal from the comparator 401, a Z1 output line for outputting a S1 signal, a Z0 output line for outputting a R1 signal and a select input pin for receiving a SELQ signal. If the select input pin receives a logic "0" signal, the signal received at the input data line is routed to the Z0 output line, otherwise it is routed to the Z1 output line.

The latch 444 includes an S input for receiving the S1 signal, a R input for receiving the R1 signal, a Q output for outputting a Q1 signal and a Qb output for outputting a Q1b signal. The latch 444 also includes an Rb input for receiving the START signal. The Rb input has precedence over the other inputs to the latch and the Rb input forces a known and convenient initial state for logic in the latch 444 when START=0, the known and convenient initial state being S=0, R=0, Q=0 and Qb=1. However, the Rb input plays no role during oscillation, i.e., when START=1 other than to allow the oscillation to occur and to continue.

The latch 446 includes an S input for receiving the Q1 signal, an R input for receiving the Q1b signal, an inverted enable input ENb, which gates the S and R inputs when 0, for receiving the CMP signal, and a Q output for outputting a SELQ signal. The latch 446 also includes a Sb input for receiving the START signal. The Sb input has precedence over the other inputs to the latch and the Sb input forces a known and convenient initial state for logic in the latch 446 when START=0, the known and convenient initial state being S=1, R=0, ENb=0 and Q=1. However, the Sb input plays no role during oscillation, i.e., when START=1 other than to allow the oscillation to occur and to continue. The Qb output of latch 446 is not used.

The schematic of FIG. 4 is based on grounded capacitors, other embodiments of the oscillator 400 using capacitors (and reference) connected to $V_{DD}$ are also possible without changes in the logic control circuitry 402.

Operation of the oscillator 400 is as follows. Beginning from instant where signal START is still de-asserted, signals Q1 and SELQ are forced to have the logical values [0, 1] respectively due to "0" logic level on pin Rb of latch 444 and pin Sb of latch 446. The oscillator 400 includes start-up circuitry (not shown), which receives the START signal to assure that capacitor C1 411 and C2 412 are discharged while the START signal is "0". The start-up circuitry causes the input terminal ICH 420 to be un-coupled from the current source and causes a $V_{RAMP}$ node 421 to be coupled to ground. The start-up circuitry plays no roles during oscillation. This combination of control signals and states causes switches 431 and 418 to be closed (and their complement switches 432 and 417 to be open). Then, capacitors C1 411 and C2 412 are discharged; wires $V_{RAMP}$, ICH1 and ICH2 are grounded, and signal CMP is de-asserted.

The condition above remains unchanged while the START signal remains de-asserted. Once the START signal changes to asserted, the logic signals initially remain as is. As capacitor C2 412 charges, wire $V_{RAMP}$ (wires ICH2 and $V_{RAMP}$ are shorted by switch 418) rises till reach the threshold of comparator 401 defined by $V_{REF}$. In one embodiment, $V_{REF}$=1V. Once the comparator 401 is asserted, latch 446 is momentarily disabled (input changes cannot be registered), and comparator signal CMP is routed inside demultiplexer 442 to output pin Z1, reaching wire S1 to input S of latch 444. Signal S1 is asserted, toggles (sets) latch 444 making Q1 to be asserted and de-asserting Q1b. This state change "re-wires" the switch connections opening switch 431, closing switch 417, followed by closing switch 432 and opening switch 418. Now the state of Q1 and SELQ are [1, 1]. As the switches are changed, $V_{RAMP}$ is connected to ICH1 and goes to the potential of capacitor C1 411 (discharged), signal CMP then is de-asserted. Latch 446 is enabled and toggles with new values of Q1 and Q1b. Then, Q1 and SELQ are [1, 0]. Signal SELQ de-asserted redirects signal CMP to signal R1. Now, the current source is connected to capacitor C1 411 (charging) while C2 412 is discharged (connected to ground in this embodiment).

With the new state defined by signals Q1 and SELQ to be respectively [1, 0], $V_{RAMP}$ rises again as C1 411 is charging. The same sequence of events takes place with the only difference is that now latch 444 toggles (resets) as signal R1 is asserted by signal CMP via demultiplexer 442, then Q1 and SELQ will be [0, 0]. After the connection between the $V_{RAMP}$ node 421 and capacitors C1 411 and C2 412 is swapped again, the signal CMP is de-asserted and the signal SELQ is updated again starting a new cycle with C2 412 being charged, back again to state Q1, SELQ as [0, 1]. This cycle repetition creates the oscillation behavior.

Latch 446 "gates" demultiplexer 442, such that it is only allowed to toggle after latch 444 changed state and the comparator 401 returned to 0. This precaution avoids meta-stability conditions that could cause Q1 and Q1b to toggle independently of exchange of capacitors 411 and 412. Advantageously, the architecture of the oscillator 400 prohibits SELQ from toggling when CMP is still at logic "1".

In the oscillator 400, changes in the demultiplexer 442 are controlled by a combination of the output of comparator 401 and the state of latch 444. Therefore, the time for changing the demultiplexer 442 is limited only by the time it takes for the comparator 401 to go to logic "0" plus the internal delay of latch 446. The toggling of SELQ depends mostly on a time required for comparator 401 to return to logic "0" because the internal delay of latch 446 is much shorter than the time required for the comparator return to logic "0".

Figure 5:
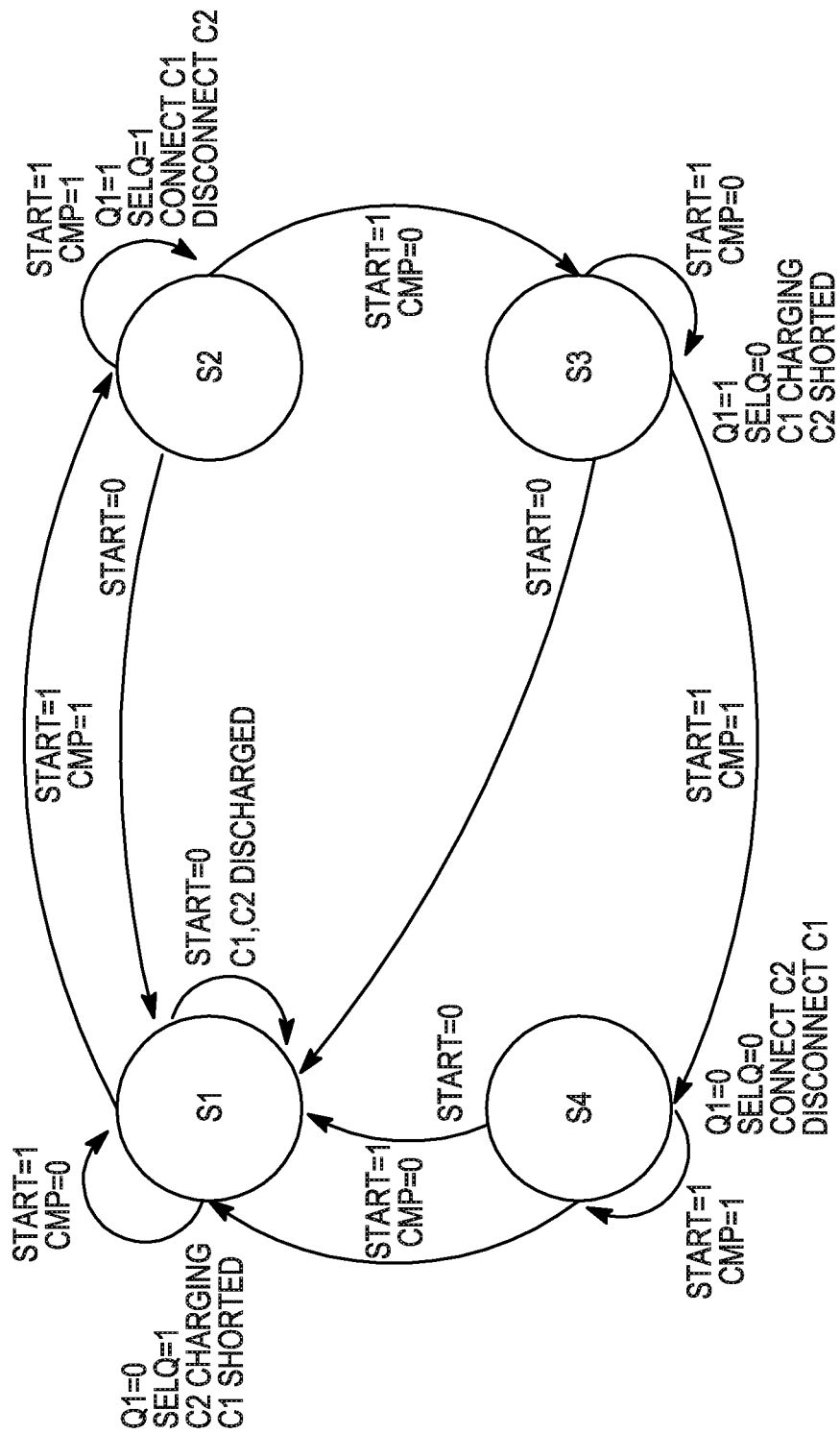
FIG. 5 is a state diagram that represents operation of the current-controlled oscillator shown in FIG. 4.

FIG. 5 is a state diagram that represents operation of the oscillator 400 in a more abstract way. The state diagram has inputs signals START and CMP and has states defined by values of Q1 and SELQ.

The oscillation is performed cyclically in four states, S1 to S4, and then starts over again and again. Two states are associated with each capacitor: S1 and S2 with C2 412, and S3 and S4 with C1 411.

State S1 corresponds to an idle condition if START is de-asserted, otherwise corresponds to the instant where C2 412 is connected to $V_{RAMP}$ and charges (while C1 411 is disconnected and remains discharged). State S3 is the state where C1 411 is connected to $V_{RAMP}$ and charges (while C2 412 is disconnected and remains discharged). The oscillator 400 stays most of time in one of these two states (charging a capacitor). The states of S2 and S4 correspond to a short period transition used to assure that demultiplexer signal control SELQ holds its value until a swap between C1 411 and C2 412 (or vice-versa) is done. Once the swap between C1 411 and C2 412 (or vice-versa) is accomplished, CMP is naturally de-asserted and SELQ is updated safely. The latch 444 should be properly triggered: SET at end of state S1 and RESET at end of state S3. Otherwise, the oscillator 400 does not oscillate at a designed frequency or does not oscillate at all.

Advantageously, all logic states are defined. The signal SELQ, used to control demultiplexer 442, is precisely defined and does not depend on delay-based solutions used in some known current-controlled oscillators.

The elements shown in FIG. 4 and the states shown in FIG. 5 are related as follows.

(START=0) S1—C1 411 and C2 412 are discharged.
(START=1) S1—C2 412 charging and C1 411 shorted. Then,
(START=1) S2—The output of comparator 401 is asserted, and latch 444 changes state. This condition causes the capacitor banks to be swapped. Then, (START=1) S3—Comparator 401 is de-asserted causes latch 446 to toggle, and then the input to demultiplexer 442 is changed safely because the output of the comparator 401 is already de-asserted, C1 411 is charging and C2 412 is shorted. Then, (START=1) S4—The output of comparator 401 is asserted, and latch 444 changes state, which causes the capacitor banks to be swapped. Then, (START=1) S1—Comparator 401 is de-asserted causes latch 446 to toggle, and then the input to demultiplexer 442 is changed safely because the output of the comparator 401 is already de-asserted, C2 412 is charging and C1 411 is shorted. Then, so on, S2, S3, S4, S1, S2, S3, S4, S1 . . .

Latch 444 is always available, so the CMP signal may be asserted at any time (or frequency). The only exception is when START=0.

Figure 6:
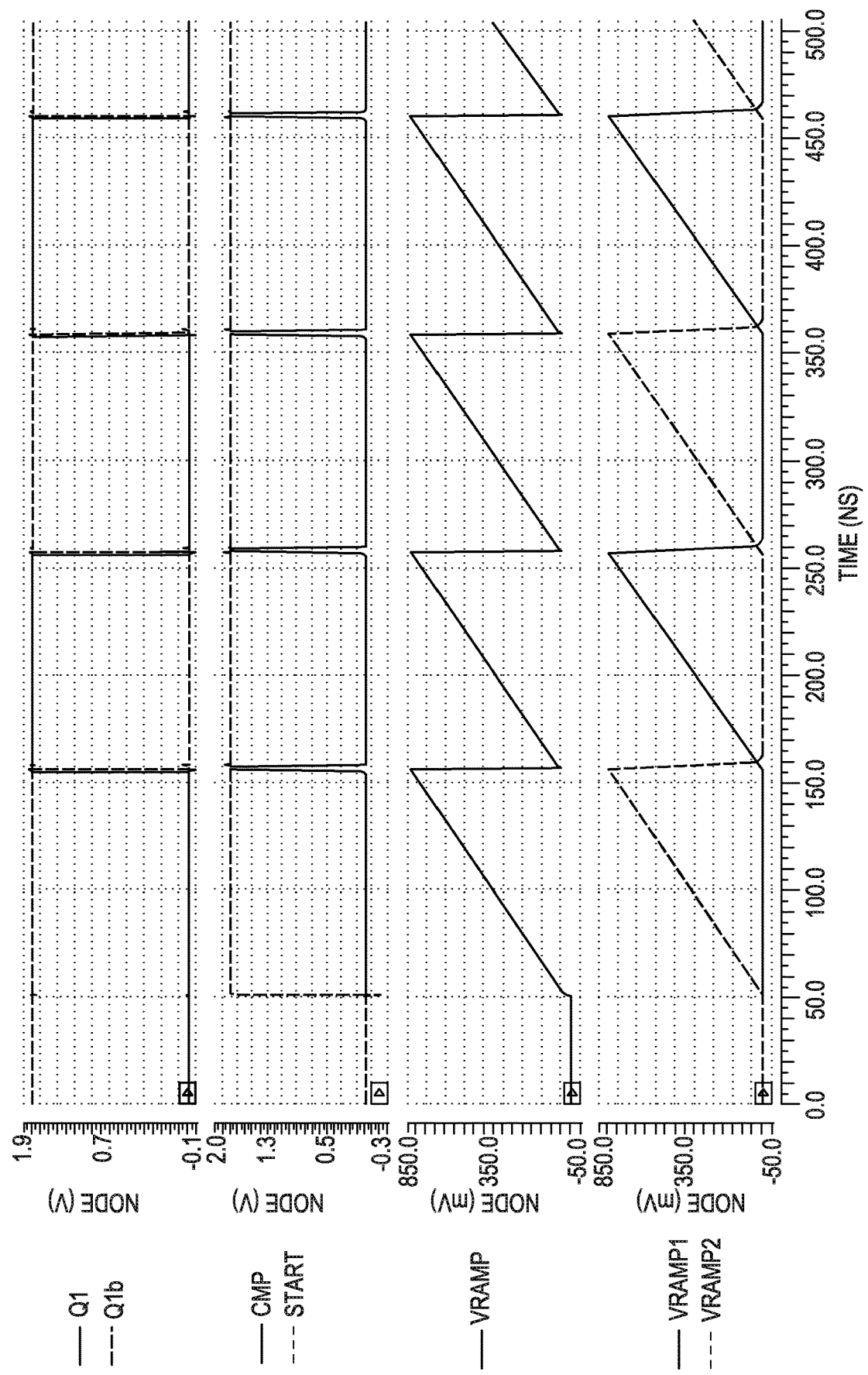
FIG. 6 is a graph of signals present in a simulation of the current-controlled oscillator shown in FIG. 4.

FIG. 6 is a graph of signals present in a simulation of the oscillator 400. The basic signals are presented: Q1, Q1$b$, START, CMP, $V_{RAMP}$, ICH1 and ICH2. Signals "Q1" or "Q1$b$" when connected to output buffers correspond to the outputs of the oscillator 400. For this simulation, $V_{DD}$ is 1.8V and the frequency of oscillation is approximately 5 MHz.

The single current source, ICH, used by the oscillator 400 may change from 1 µA to 250 µA. When ICH=1 µA, the frequency of operation is 40 kHz. When ICH=250 µA, the frequency of operation is 10 MHz.

Figure 7:
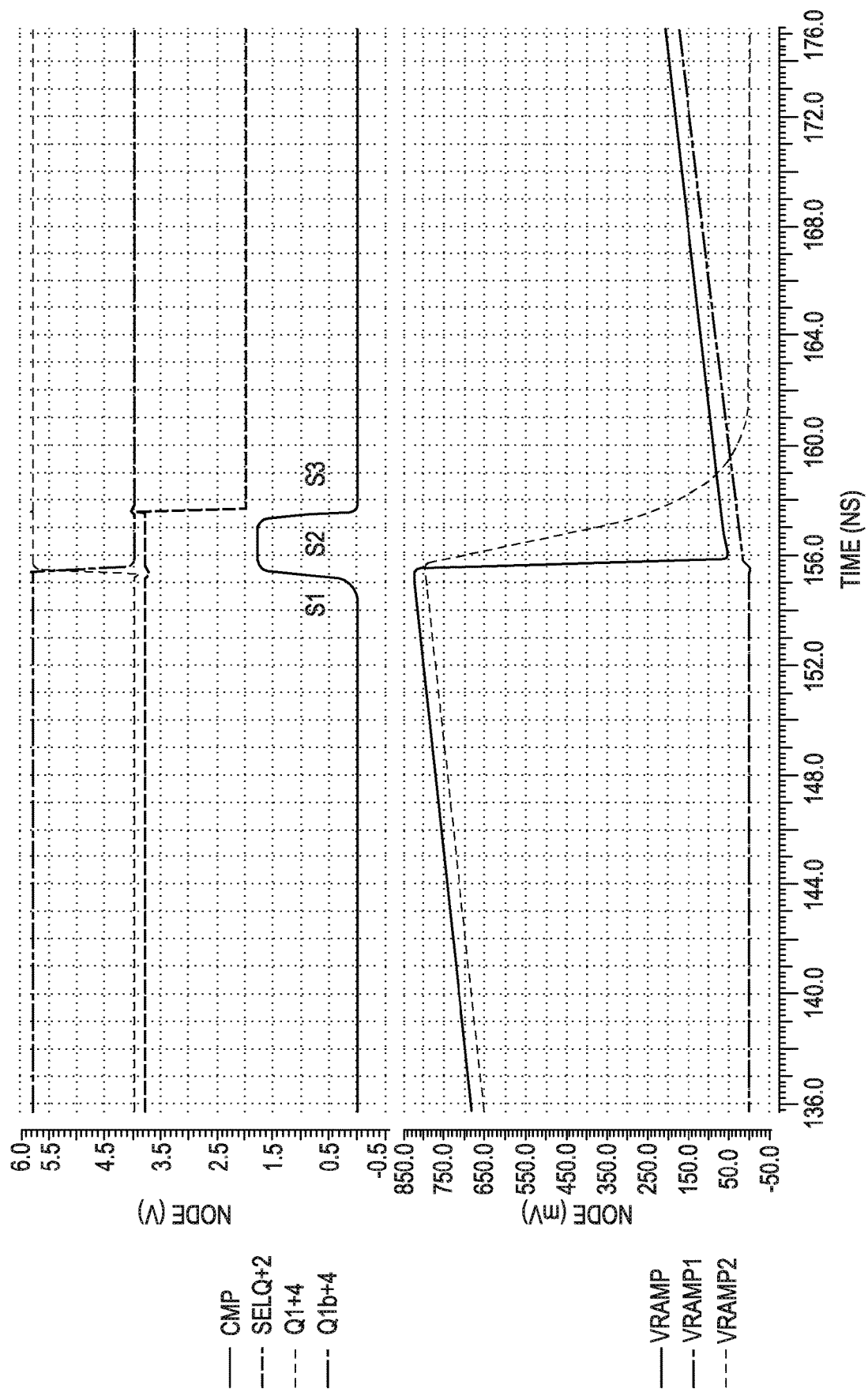
FIG. 7 shows a transition detail of the signals present in a simulation of the current-controlled oscillator shown in FIG. 4.

FIG. 7 shows detail of a transition, including corresponding states, of the signals present in a simulation of the oscillator 400. FIG. 7 shows CMP being asserted and causing state transition from S1 to S2. As C2 412 and C1 411 are swapped (ICH2 and ICH1), CMP is de-asserted and SELQ is updated and there is a state transition from S2 to S3. The same kind of behavior would be seen if another snapshot of next CMP transition were taken (from state S3 to state S4 to state S1).

Latch 444 is asserted/de-asserted by a voltage level of signal CMP, so the signal CMP lasts long enough to allow the change in the latch to occur. This is straight forward because the input of the comparator 401 changes only after latch 444 is updated and a response of the comparator is much slower than gate delays within the latch. Gate delays within the latches 444 and 446 are less than 1 ns.

A bias input current to comparator 401 is not shown in the drawings but is well known to persons skilled in the art. A power supply to the logic control circuitry 402 and to the switches is not shown in the drawings but is well known to persons skilled in the art.

Advantageously, the design of the oscillator 400 assures that latches 444 and 446 are not asserted at a same time.

In one application, oscillator 400 is used as a precision current-to-frequency converter.

The oscillators 200 and 400 reduce a number of critical components while improving robustness.

Although the switches of oscillators 200 and 400 are shown pictorially as single-throw switches, each of them are, in fact, NMOS or PMOS transistors configured in a manner well known to persons skilled in the art. Other types of electronic devices acting as switches of the oscillators 200 and 400 are foreseeable.

The oscillators 200 and 400 are portable to any technology in use (bipolar, bulk complementary metal oxide semiconductor, silicon on insulator, etc.). The oscillators 200 and 400 can be employed where a robust and precise controlled-current oscillator is required with area and power gains when compared traditional architectures. The oscillators 200 and 400 can be employed as voltage controller oscillators if a voltage-to-current converter is used to feed the input current.

The term "coupled", as used herein, is defined as "connected", and encompasses the coupling of devices that may be physically, electrically or communicatively connected, although the coupling may not necessarily be directly, and not necessarily be mechanically. The term "configured to" describes hardware, software or a combination of hardware and software that is adapted to, set up, arranged, built, composed, constructed, designed or that has any combination of these characteristics to carry out a given function.

The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The Detailed Description section, and not the Abstract section, is intended to be used to interpret the claims. The Abstract section may set forth one or more but not all embodiments of the invention, and the Abstract section is not intended to limit the invention or the claims in any way.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages or solutions to problems that are described herein with regard to specific embodiments are not intended to be construed as a critical, required, or essential feature or element of any or all the claims.

What is claimed is:

1. A current-controlled oscillator, comprising:
   an input terminal for receiving an input current;
   a ramp voltage generating sub-circuit, coupled to the input terminal, for generating a first ramp voltage and a second ramp voltage during alternate cycles of a clock signal, wherein a frequency of the clock signal is based, in part, on a value of the input current;
   a ramp voltage selecting sub-circuit for selecting one of the first ramp voltage and the second ramp voltage depending on a value of the first ramp voltage relative to a value of the second ramp voltage; and
   a switching signal generating sub-circuit for receiving the selected ramp voltage and for generating a switching signal based on a value of the selected ramp voltage relative to a reference voltage,
   wherein the switching signal generating sub-circuit outputs clock signal CLK1 and clock signal CLK2.

2. The current-controlled oscillator of claim 1, wherein the ramp voltage generating sub-circuit includes a first capacitor coupled between a ground terminal and a first ramp voltage node, and a second capacitor coupled between the ground terminal and a second ramp voltage node.

3. The current-controlled oscillator of claim 2, wherein the input current charges the first capacitor to produce the first ramp voltage at the first ramp voltage node and the input current charges the second capacitor to produce the second ramp voltage at the second ramp voltage node.

4. The current-controlled oscillator of claim 3, wherein the first ramp voltage node is switched between being coupled to the input terminal during one half cycle of the clock signal and being coupled to the ground terminal during another half cycle of the clock signal, and wherein the second ramp voltage node is switched between being coupled to the ground terminal during the one half cycle of the clock signal and being coupled to the input terminal during the another half cycle of the clock signal.

5. The current-controlled oscillator of claim 1, wherein the ramp voltage generating sub-circuit includes a first switch, controlled by clock signal CLK1, coupled between the first ramp voltage node and the input terminal, and a second switch, controlled by clock signal CLK2, coupled between the second ramp voltage node and the input terminal.

6. The current-controlled oscillator of claim 1, wherein the ramp voltage generating sub-circuit includes a third switch controlled by clock signal CLK2 coupled between the input terminal and the ground terminal, and a fourth switch controlled by clock signal CLK1 coupled between the input terminal the ground terminal.

7. The current-controlled oscillator of claim 1, wherein the ramp voltage selecting sub-circuit includes a ramp voltage comparator for comparing the first ramp voltage and the second ramp voltage and for outputting a comparator output signal and wherein, based on comparison, the ramp voltage selecting sub-circuit outputs one of the first ramp voltage and the second ramp voltage.

8. The current-controlled oscillator of claim 1, wherein the ramp voltage selecting sub-circuit includes a switch, controlled by the comparator output signal, coupled between the first ramp voltage node and an output of the ramp voltage selecting sub-circuit, and a switch, controlled by an inverted comparator output signal, coupled between the second ramp voltage node and the output of the ramp voltage selecting sub-circuit, such that, at any time, one of the first ramp voltage and the second ramp voltage is outputted by the ramp voltage selecting sub-circuit.

9. The current-controlled oscillator of claim 1, wherein the switching signal generating sub-circuit includes a single comparator in a frequency generation path, the single comparator having a non-inverted input terminal coupled to the ramp voltage selecting sub-circuit for receiving one of the first ramp voltage and the second ramp voltage and having an inverted input terminal coupled to a voltage reference $V_{REF}$.

10. The current-controlled oscillator of claim 9, wherein an output terminal of the single comparator is coupled to an R input pin of a latch through a first switch controlled by the comparator output signal, and coupled to an S input pin of the latch through a second switch controlled by an inverted comparator output signal, such that, at any time, the output terminal of the single comparator is coupled to one of the R input pin of latch and the S input pin of the latch.

11. The current-controlled oscillator of claim 10, wherein a Qb output pin of the latch provides clock signal CLK1 and a Q output pin of the latch provides clock signal CLK2.

* * * * *